United States Patent
Yagi et al.

(10) Patent No.: US 6,432,521 B1
(45) Date of Patent: Aug. 13, 2002

(54) GROUP III-V COMPOUND SEMICONDUCTOR, AND SEMICONDUCTOR DEVICE USING THE COMPOUND SEMICONDUCTOR

(75) Inventors: Shigeru Yagi; Seiji Suzuki, both of Minamiashigara (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 09/576,552

(22) Filed: May 24, 2000

(30) Foreign Application Priority Data

Jul. 7, 1999 (JP) .......................... 11-193448

(51) Int. Cl.[7] .................. H01L 29/02; H01L 29/20; H01L 27/14; B32B 15/01
(52) U.S. Cl. .................. 428/209; 428/620; 428/621; 428/642; 428/697; 428/698; 423/406; 257/53; 257/615; 257/431
(58) Field of Search .................. 428/209, 620, 428/642, 621, 697, 698; 423/406, 299; 257/13, 79, 80, 103, 52, 53, 615, 431; 117/952, 954, 955, 953; 148/DIG. 65

(56) References Cited

U.S. PATENT DOCUMENTS

| | | | | |
|---|---|---|---|---|
| 5,468,678 A | * | 11/1995 | Nakamura et al. | 437/107 |
| 5,563,422 A | * | 10/1996 | Nakamura et al. | 257/13 |
| 5,786,233 A | * | 7/1998 | Taskar et al. | 438/46 |
| 5,877,558 A | * | 3/1999 | Nakamura et al. | 257/749 |
| 5,925,897 A | * | 7/1999 | Oberman | 257/80 |
| 5,986,285 A | * | 11/1999 | Yagi | 257/53 |
| 6,150,677 A | * | 11/2000 | Tanaka et al. | 257/201 |

OTHER PUBLICATIONS

Nakamura et al., *Thermal Annealing Effects on P-Type Mg-Doped GaN Films*, Jpn Appl. Phys., vol. 31, 1992, pp. L139–L142. (No month).

* cited by examiner

Primary Examiner—Deborah Jones
Assistant Examiner—Stephen Stein
(74) Attorney, Agent, or Firm—Oliff & Berridge, PLC

(57) ABSTRACT

This invention provides a Group III–V compound semiconductor that is free from the limitation of the shape and the size, is economical, is excellent in photo-electric characteristics (photo-electric conductivity photo-electromotive current, photo-electromotive force, quantum efficiency), can freely select the optical gap over a broad range, has high performance as a photo-semiconductor, has limited change with time, and is excellent in response, environmental resistance characteristics and high temperature resistance. The Group III–V compound semiconductor contains a Group III element and a Group V element of the Periodic Table as principal components, and contains also 0.1 atom % to 40 atom % of hydrogen atoms and 100 ppm to 20 atom %, based on the sum of the atomic numbers of the Group III element and the Group V element, of at least one element selected from among Be, Mg, Ca, Zn and Sr.

9 Claims, 5 Drawing Sheets

300nm

300nm

GROUP III–V COMPOUND SEMICONDUCTOR, AND SEMICONDUCTOR DEVICE USING THE COMPOUND SEMICONDUCTOR

BACKGROUND OF THE INVENTION

1. Field of the Invention

This invention relates to a semiconductor for electronics and a semiconductor device using the semiconductor. More particularly, this invention relates to Group III–V compound semiconductor that will be suitable for a novel and excellent optical semiconductor, and a semiconductor device.

2. Description of the Related Art

Recently, a blue-color light emitting diode using InGaN of Group III–V compound semiconductor has been put into practical use, and blue-color laser oscillation has come close to a practical level. Such Group III–V compound semiconductor is fabricated on a substrate by crystal growth under a high temperature condition of 800 to 1,100° C. by chemical vapor phase deposition of an organometallic compound (MOCVD).

A sapphire substrate or a silicon carbide substrate is generally used as the substrate on which the Group III–V compound semiconductor is grown. Though transparent, the sapphire substrate is an insulating substrate. The size of the sapphire substrate is limited, and its cost is high. The silicon carbide substrate is electrically conductive but is more expensive than the sapphire substrate. Its size, too, is limited much more than the sapphire substrate. The crystal growth of the Group III–V compound semiconductor on these substrates is made using a buffer layer of GaN or AlN.

In comparison with silicon materials that account for the major proportion of present semiconductor devices and products, the Group III–V compound semiconductor has a great difference of the lattice constant and cannot provide a quality film. Therefore, crystal growth is made using an SiC buffer layer, or the AlN or GaN low temperature growth buffer layer employed for the sapphire substrate. Nonetheless, satisfactory quality cannot yet be acquired.

Great effects will be obtained in both aspects of performance and cost in hybridization of an electronic device using a silicon semiconductor and an optical semiconductor using Group III–V compound semiconductor if the Group III–V group semiconductor can be directly formed on a silicon material.

As described above, however, the conventional Group III–V compound semiconductor is fabricated generally by the chemical vapor phase deposition of an organometallic compound at a high temperature of 800 to 1,100° C. Therefore, film quality is affected greatly not only by the difference of the lattice constants but also by the difference of thermal expansion coefficients.

When the film is formed on the substrate having a great difference in both lattice constant and thermal expansion coefficient such as a silicon material, the influences of these factors must be taken into account and the low temperature growth is preferably carried out.

Hydrogenated amorphous silicon or microcrystal silicon material is suitable for the substrate of two-dimensional devices having a relatively large area. According to the prior art technologies using the high temperature, however, constituent elements and addition elements fall off at the time of heating of the substrate, and the Group III–V compound semiconductor cannot be fabricated on such a substrate.

A greater area and a lower cost of production could be achieved in display devices and optical photo-electromotive devices if a glass substrate could be used as a transparent substrate. However, the prior art methods cannot fabricate the Group III–V compound semiconductor due to the limit of the heat resistance of glass.

The temperature that can be employed for these various substrates is determined primarily by the occurrence of crack and peel that result from the difference of the thermal expansion coefficients between the substrate and the film to be formed, heat resistance of the substrate itself (such as softening point, crystallization point, fall-off of constituent elements and addition elements), and so forth. For instance, if hydrogenation is made in a post-treatment in not only a hydrogenated amorphous silicon but also mycrocrystalline silicon, substrate performance cannot be secured at a temperature of 600° C. or above if any element is added.

A low temperature film forming method makes it possible to directly form a film on these substrates on which the film formation has been difficult in the past. For this reason, Group III–V compound semiconductor that can be formed at a low temperature has been eagerly required.

Therefore, the inventors of the present invention have proposed a method that uses remote plasma as the low-temperature film forming method. Though the Group III–V compound semiconductor film formed by such a film forming method can provide film characteristics such as photo-electric conductivity, further improvements are yet to be made because sensitivity and response are not sufficient for use in optical semiconductor devices.

It has been reported in the past that in the Group III–V compound semiconductors fabricated at 800 to 1,100° C. by the conventional vapor phase deveoposition method of the organometallic compound, a p type dopant combines with a trace amount of hydrogen atoms and hinders activation of the dopant, and annealing at 400° C. or above, preferably at 600° C. or above, in a nitrogen atmosphere is therefore necessary. When low-temperature film formation is conducted, an additive, an adding method, a film-forming method, etc., that do not call for such an annealing treatment, are necessary for the low-temperature film formation.

Though intensive studies have been made on such Group III–V compound semiconductors, further improvements must be yet made.

Solar cells have been utilized vigorously in recent years. To use them in all places, the solar cells are used preferably in the form that is free from limitation as much as possible. Nonetheless, the conventional solar cells involve the problems in design such as colors, and have therefore been used in only limited places.

SUMMARY OF THE INVENTION

In view of the problems with the prior art technologies described above, the present invention is directed to improve the drawbacks of the Group III–V compound semiconductors.

According to one aspect of the present invention, there are provided an economical Group III–V compound semiconductor free from the limitation of shape and size, and a semiconductor device using the compound semiconductor.

According to another aspect of the present invention, there are provided Group III–V compound semiconductor excellent in photo-electric characteristics (photo-electric conductivity, photo-electromotive force, quantum efficiency), and a semiconductor device using the compound semiconductor.

According to still another aspect of the present invention, there are provided Group III–V compound semiconductor that makes it possible to freely select an optical gap over a broad range, has only a limited change with time, and is excellent in response, environmental resistance characteristics and high-temperature resistance, and a semiconductor device using the compound semiconductor.

The inventors of the present invention have conducted intensive studies on the drawbacks of the conventional Group III–V compound semiconductors described above, and have completed the present invention. The gist of the present invention resides in the following points.

<1> A group III–V compound semiconductor containing principally a Group III element and a Group V element of the Periodic Table, and containing 0.1 to 40 atom % of hydrogen atoms and 100 ppm to 20 atom %, based on the sum of the atomic numbers of the Group III element and the Group V element, of at least one element selected from among Be, Mg, Ca, Zn and Sr.

<2> A Group III–V compound semiconductor according to the item <1>, that contains 2,500 ppm to 15 atom %, based on the sum of the atomic numbers of the Group III element and the Group V element, of at least one element selected from among Be, Mg, Ca, Zn and Sr.

<3> A Group III–V compound semiconductor according to the item <1> or <2>, that is a non-single crystal compound.

<4> A Group III–V compound semiconductor according to any of the items <1> through <3>, that has a columnar structure.

<5> A Group III–V compound semiconductor according to any of the items <1> through <4>, wherein each of Ia/Ic and Ib/Ic is not greater than 0.5 where Ia is absorbance of an infrared absorption peak based on bonding between the Group V element and the hydrogen atom, Ib is absorbance of an infrared absorption peak based on bonding between the Group III element and the hydrogen atom, and Ic is absorbance of an infrared absorption peak based on bonding between the Group III element and the Group V element.

<6> A Group III–V compound semiconductor according to any of the items <1> through <5>, wherein an absorption coefficient (absorbance/film thickness) of the infrared absorption peak based on bonding between the Group V element and the hydrogen atom and an absorption coefficient (absorbance/film thickness) of the infrared absorption peak based on bonding between the Group III element and the hydrogen atom are 5 $cm^{-1}$ to 5,000 $cm^{-1}$, respectively.

<7> A semiconductor device including a layer formed of the Group III–V compound semiconductor according to any of the items <1> through <6> and a second electrode disposed on a first electrode.

<8> A semiconductor device according to the item <7> which is an photo-electromotive device or a light reception device.

<9> A semiconductor device according to the item <7> which bears the two functions of an photo-electromotive device and a light reception device.

The film of the Group III–V compound semiconductor according to the present invention can be formed at a low temperature. Therefore, it can be formed on a free substrate at a low cost of production without the limitation of its shape and size.

The Group III–V compound semiconductor according to the present invention is excellent in photo-electric characteristics when it contains a specific amount of at least one member selected from among Be, Mg, Ca, Zn and Sr.

The Group III–V compound semiconductor according to the present invention can freely select an optical gap over a broad range depending on its composition, has high performance as an optical semiconductor and a limited change with time, and is excellent in response, environmental resistance characteristics and high temperature resistance.

BRIEF DESCRIPTION OF THE DRAWINGS

Preferred embodiments of the present invention will be described in detail with reference to the accompanying drawings, wherein.

DESCRIPTION OF THE PREFERRED EMBODIMENTS

Figure 1:
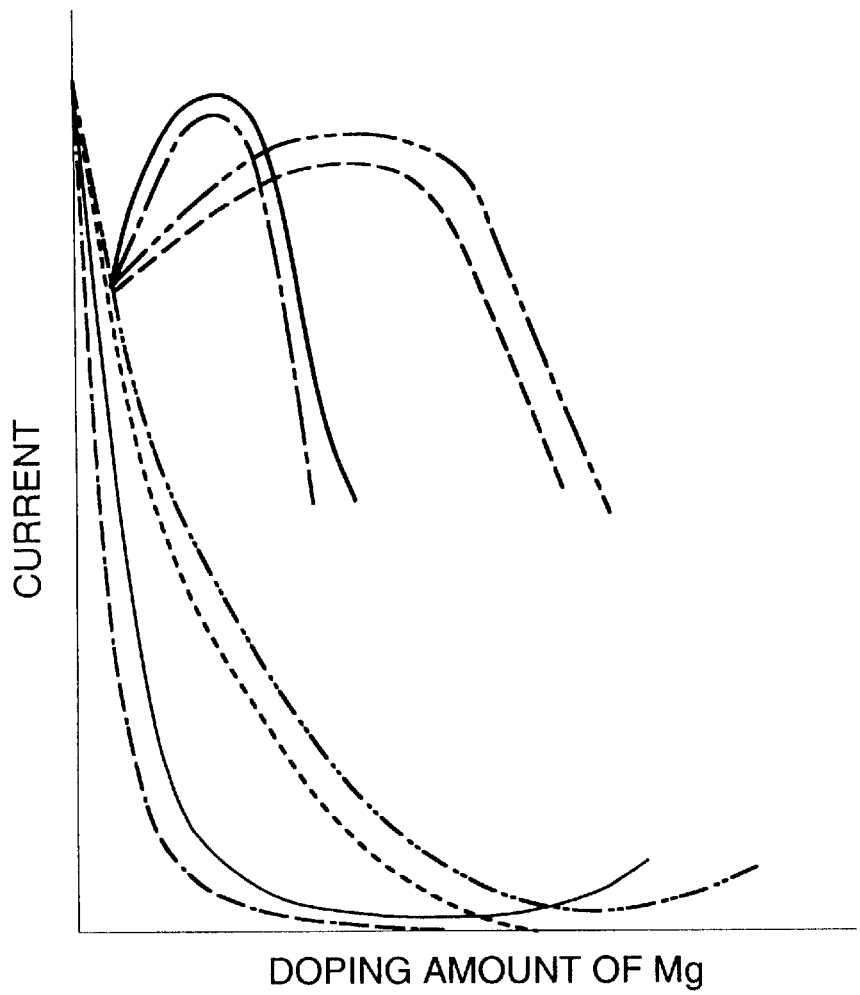
FIG. 1 is a diagram showing the relationship of a photo-electric current, a photo-electromotive current, a dark current and a dark electromotive current with respect to a doping amount of Mg.

Hereinafter, the Group III–V compound semiconductor (which will be called simply the "film" in some cases) will be explained in further detail.

The Group III–V compound semiconductor according to the present invention contains a Group III element and a Group V element of the Periodic Table as the principal components, and contains also 0.1 to 40 atom % of hydrogen atoms and 100 ppm to 20 atom %, based on the sum of the atomic numbers of the Group III and V elements, of at least one element selected from among Be, Mg, Ca, Zn and Sr.

The Group III–V compound semiconductor according to the present invention may be a single crystal compound or a non-single crystal compound, but is preferably the non-single crystal compound.

The term "non-single crystal" used herein means an amorphous crystal, a microcrystal, a polycrystal or their mixture (e.g. mixture of microcrystal and amorphous crystal).

The term "amorphous" means those crystals in which a ring-like diffraction pattern is not at all observed in a transmission electron beam diffraction pattern, but which exhibit a vague hollow pattern with complete lack of a long distance order, those crystals in which a ring-like diffraction pattern is observed in the hollow pattern and those in which a calescence point can be further observed in the diffraction pattern. However, hardly any peak can be obtained in most cases in X-ray diffraction analysis of such an amorphous film that inspects the film over a broad range by transmission electron beam diffraction.

The crystal system of the microcrystal described above may be either a cubic system or a hexagonal system. Furthermore, the crystal system may be a mixed system in which plural crystals are mixed. The size of the microcrystal is 5 nm to 10 $\mu$m, preferably 10 nm to 10 $\mu$m, and more preferably 15 nm to 10 $\mu$m. The size of the microcrystal can be determined by X-ray diffraction and electron beam diffraction, and by the shape measurement of the section obtained by an electron micrograph. Incidentally, the term "microcrystal" means those crystals in which a large number of calescence points can be observed together with a ring-like diffraction pattern or only spot-like calescence points can be observed, in the transmission electron beam diffraction pattern, for example. However, the film formed of such a microcrystal exhibits slight corresponding peaks in the crystal plane in the X-ray diffraction measurement, but the peak intensity is weaker than that of the single crystal with peak width being greater than that of the latter in most cases.

The polycrystal described above may be a group of crystals containing plural plane orientations. It may be also a group of microcrystals that grow mainly in a certain plane orientation. In this case, the polycrystal may assume the state where small columnar crystals are aligned in the growing direction. The size of the columnar crystals is 1nm to 10 μm, preferably 5 nm to 10 μm and more preferably, 10 nm to 10 μm. The film formed of such a polycrystal mainly exhibits the peak of a single crystal plane in the X-ray diffraction measurement. Its peak intensity is high and its half-width value is small. The half-width value is 1 arcmin to 1°, preferably 1 arcmin to 0.5° and more preferably 1 arcmin to 0.1°. The group of the crystals including plural plane orientations, and its size, can be measured by using a transmission electron micrograph or a scanning electron micrograph.

The growth section of the film in the Group III–V compound semiconductor according to the present invention preferably has a columnar structure from the aspect of mobility when a current flows inside the crystal, and from the aspect of less existence of deep traps. This columnar structure is the one that has a size of at least 1 nm, preferably at least 5 nm and more preferably at least 10 nm (in terms of the width in section). The overall columnar structure may have a uniform or non-uniform size. The direction of the columnar structure may be aligned completely, or those crystals which grow obliquely may exist in mixture. The diameter of the columnar structure may change from the substrate side in the growing direction. The columnar structure may contain between the structure a mass-like structure other than the columnar structure, or a uniform structure in mixture. Furthermore, the columnar structure may contain irregular structures on the interface side with the substrate, in mixture. The columnar structure can be confirmed directly by the sectional photograph taken by a transmission electron microscope or a scanning electron microscope. The columnar structure can be judged also from the diffraction peak and its intensity of an X-ray diffraction spectrum, the line width of an X-ray locking curve, and the line, spot and streak patterns of a reflection high-speed electron beam diffraction image.

The Group III–V compound semiconductor according to the present invention can easily form a film on a free substrate material at a low temperature. Therefore, it is free from the limitation of the shape and the size, and is economical.

The Group III–V compound semiconductor according to the present invention contains preferably at least one element selected from among Al, Ga and In as the Group III element and at least one element selected from among N, P and As as the Group V element of the Periodic Table. The compound semiconductor contains particularly nitrogen as the Group V element because the composition ratio can easily keep the stoichiometric state.

The Group III–V compound semiconductor can arbitrarily change the optical gasp of the film by adjusting the mixing ratio of the Group III element. For instance, the optical gap of 3.2 to 3.5 eV of the GaN:H film as the reference can be increased to about 6.5 eV when Al is added, and the film can cope with the ultraviolet region. When In is added, the optical gap can be lowered to about 1.9 eV, and the film can cope with the visible region.

When the sum of the atomic number of the Group III element is x and the atomic number of the Group V element is y in the Group III–V compound semiconductor according to the present invention, the ratio (x:y) of x to y is preferably 1.0:0.5 to 1.0:2.0, more preferably 1.0:0.6 to 1.0:1.7 and further preferably 1.0:0.8 to 1.0:1.3. If the ratio of x to y is outside the range described above, the portions that assume the cubic crystal and the zincblende type become smaller in bonding between the Group III element and the Group V element with the result that crystal defects become greater and the semiconductor does not function as an excellent semiconductor. Each element composition can be measured by methods such as X-ray photoelectric spectroscopy (XPS), an electron microprobe, Rutherford Back-Scattering (RBS) and secondary ion mass spectroscopy.

The Group III–V compound semiconductor according to the present invention contains 0.1 to 40 atom % of hydrogen atoms, preferably 0.2 to 35 atom %, and more preferably 0.3 to 30 atom %. Generally, when the Group III–V compound semiconductor is the non-single crystal compound, bonding defects and non-bonded bonds are likely to occur in both the Group III element and the Group V element to accomplish the amorphous structure while the three-dimensional structure is maintained. Also, bonding defects are likely to occur in the crystal grain boundary in both the Group III element and the Group V element to accomplish the three-dimensional structure by the microcrystal. Therefore, the hydrogen atoms are contained to compensate for such crystal defects and/or non-bonded bonds. In other words, the hydrogen atoms are bonded to both the Group III element and the Group V element. In this way, the bonding defects and/or the non-bondedbonds are eliminated through bonding with the hydrogen atoms and the defect level formed inside the band can be inactivated. When the Group III–V compound semiconductor is a single crystal compound, factors that hinder conduction such as shallow traps, deep traps, etc., can be eliminated as the defective portions such as the dangling bonds resulting from line defects, dislocation defects or bonding defects, are offset by the hydrogen atoms.

If the hydrogen concentration is less than 0.1 atom %, it is not sufficient for eliminating the bonding defects and/or non-bonded bonds of the Group III and V elements by bonding with the hydrogen atoms and for inactivating the defective level formed inside the band. Since the bonding defects and the structural defects remain as such, the trap center increases, so that the optical semiconductor device fails to exhibit excellent characteristics.

If the hydrogen concentration exceeds 40 atom %, on the other hand, the probability of bonding of two or more hydrogen atoms with the Group III and V elements increases. As a result, these elements do not keep the three-dimensional structure but form the two-dimensional and chain-like networks in some cases. Particularly because large quantities of voids are formed in the crystal grain boundary, electrical characteristics get deteriorated and mechanical properties such as hardness drop.

If the hydrogen concentration exceeds 40 atom %, the light emitting layer becomes more likely to be oxidized. In consequence, large quantities of impurity defects are formed inside the film, and excellent photo-electrical characteristics cannot be obtained in some cases.

Furthermore, when the hydrogen concentration exceeds 40 atom %, the hydrogen atoms inactivate in some cases the dopant that is doped for controlling the electrical characteristics. In consequence, the Group III–V compound semiconductor formed of the electrically active amorphous crystal or microcrystal cannot be obtained in some cases.

The absolute value of the hydrogen concentration can be measured by hydrogen forward scattering (HFS). It can be estimated also by measuring the emission quantity of the hydrogen atoms by heating, or by measuring the infrared absorption spectrum. The hydrogen atom of less than 10 atom % can be measured by secondary ion mass spectrometer (SIMS).

The hydrogen concentration can be estimated in the following way, for example. In the infrared absorption spectrum of a film (GaN:H) formed by the remote plasma chemical vapor deposition method of the organometallic compound by remote plasma using GaN with Si for the substrate, an absorption peak resulting from stretching vibration of N—H and an absorption peak resulting from stretching vibration of GaH can be observed near 3,230 $cm^{-1}$ and near 2,100 $cm^{-1}$, respectively, when gallium is used as the Group III element. The hydrogen concentration can be estimated by comparing the absorption coefficient of each absorption peak with a known hydrogen concentration.

Crystallinity of the Group III–V compound semiconductor according to the present invention drops (crystallization to the non-single crystal) in many cases with an increasing hydrogen concentration, and the drop of crystallinity appears in IR absorption, RHEED and XRD. In the case of the infrared absorption spectrum of the film (GaN:H) containing not greater than 10 atom % of hydrogen atoms, for example, the absorption peak resulting from the stretching vibration of the Group V element and the hydrogen atom, and the absorption peak near 2,100 $cm^{-1}$ resulting from the stretching vibration of the Group III element and the hydrogen atom, are small. However, when the absorption peak resulting from the skeletal vibration of the Group III element and the Group V element is strong. Even when the line width is small, the absorption peak resulting from the stretching vibration of the Group V and the hydrogen atom, and the absorption near 2,100 $cm^{-1}$ resulting from the stretching vibration of the Group III element and the hydrogen atom, become strong due to the increase of the hydrogen atoms. The strong absorption peak resulting from the skeletal vibration of the Group III element and the Group V element becomes weak near 560 $cm^{-1}$ and the line width becomes broad.

In the Group III–V compound semiconductor according to the present invention, the drop of crystallinity with the increase of the hydrogen concentration can be observed in the transmission electron beam diffraction pattern and reflection high-speed electron beam diffraction (RHEED). For example, the spot-like pattern and the streak-like pattern the ring of which is cut close to the spot shape, and a vague ring-like diffraction pattern, can be observed. The peak width and the intensity drop in the X-ray diffraction, too. The peaks may be those which cannot be distinguished. A plane orientation may be substantially one.

Both ratios Ia/Ic and Ib are preferably not greater than 0.5, more preferably not greater than 0.3 with the lower limit of at least 0.001 when the absorbance of the infrared absorption peak based on bonding between the Group v element and the hydrogen atom is Ia, the absorbance of the infrared absorption peak based on bonding between the Group III element and the hydrogen atom is Ib and the absorbance of the infrared absorption peak based on bonding between the Group III element and the v element is Ic in the Group III–V compound semiconductor according to the present invention. If Ia/Ic and Ib/Ic are less than 0.001, the amount of the hydrogen atoms contained in the film is small, and the photo-electrical characteristics drop in some cases. If the ratios exceed 0.5, film quality changes. More concretely, crystallinity drops excessively. In consequence, the film becomes amorphous and is more likely to be oxidized, so that optical sensitivity and photo-electrical characteristics drop in some cases.

The relative amount of the hydrogen atoms, and furthermore, film quality, can be estimated by comparing Ia, Ib and Ic with one another. Both Ia/Ic and Ib/Ic increase with the increase of the hydrogen concentration and along therewith, film quality changes, too. Each of Ia, Ib and Ic is the difference value obtained by subtracting the background near each infrared absorption spectrum.

When the film is formed on a substrate transparent to the infrared rays (for example, substrates of NaCl, KBr, Si), Ia, Ib and Ic can be measured by transmission of the infrared absorption spectrum. When the film is formed on a substrate opaque to the substrate, Ia, Ib and Ic can be measured by using the film that is formed on the infrared-transparent substrate under the film forming condition. In this case, the error of the film growth occurs depending on the substrate, but such a difference can be neglected in the case of the non-single crystal film.

In the Group III–V compound semiconductor according to the present invention, the absorption coefficient (absorbance/film thickness) of the infrared absorption peak based on bonding between the Group V element and the hydrogen atom and the absorption coefficient (absorbance/film thickness) of the infrared absorption peak based on bonding between the Group III element and the hydrogen atom are preferably 5 $cm^{-1}$ to 5,000 $cm^{-1}$, more preferably 7 $cm^{-1}$ to 3,000 $cm^{-1}$ and further preferably, 10 $cm^{-1}$ to 1,000 $cm^{-1}$. If each absorption coefficient (absorbance/film thickness) is less than 5 $cm^{-1}$, the amount of the hydrogen atoms contained in the film is so small that the photo-electric characteristics such as photo-conductivity are likely to drop. If it exceeds 5,000 $cm^{-1}$, on the other hand, film quality changes. More concretely, crystallinity drops excessively. In consequence, the film becomes an amorphous film, is likely to be oxidized, and photosensitivity and photo-electric characteristics drop in some cases.

The absorption coefficient (absorbance/film thickness) makes it possible to estimate the absolute amount of the hydrogen atoms and to estimate film quality. When the film is formed on a sapphire substrate that is transparent to a part of the infrared region, the infrared absorption of the Group V element-hydrogen atoms and the Group III element-hydrogen atoms can be measured. However, the infrared absorption of the Group III element-Group V element cannot be measured. Therefore, since the relative values of the absorption peaks of the Group III element-Group V element cannot be compared, the absorption coefficient as the quotient obtained by dividing absorbance by the film thickness is used. Incidentally, when the infrared absorption of the sapphire substrate is compared with that of the Si substrate, they are in agreement in the error range.

The Group III–V compound semiconductor according to the present invention contains 100 ppm to 20 atom % of at least one element (hereinafter called the "specific element (s)" in some cases) selected from among Be, Mg, Ca, Zn and Sr. Since the hydrogen atoms contained mitigate the defects, this specific element can improve the photo-electric characteristics. The photo-electric characteristics can be improved further when a specific amount of the specific element is contained in the Group III–V compound semiconductor having good photo-electric characteristics (for example, a small dark current and a relatively great photo-electromotive current). The specific element plays also the function of controlling the p type.

The Group III–V compound semiconductor according to the present invention contains 100 ppm to 20 atom %, preferably 2,500 ppm to 15 atom %, of the specific element on the basis of the sum of the atomic numbers of the Group III element and the Group V element. If the concentration of this specific element is less than 100 ppm, the dark current is great while the photo-electric current is small, so that the photo-electric characteristics are not sufficient. If it exceeds 20 atom %, on the other hand, the film structure becomes different from the original film structure of the Group III–V compound semiconductor and the photo-electric current becomes small with the drop of photo-electric conductivity.

The optimum concentration of the specific element is different between the film having a small defect level (for example, a film in which the hydrogenatoms compensate for the defect level such as the dangling bond) and the film containing great quantities of dangling bonds in many grain boundaries of the microcrystal, depending on film quality of the original Group III–V compound semiconductor. Therefore, the optimum concentration of the specific element is selected appropriately from the range described above in accordance with film quality, that is, with the defect level density amount. More concretely, the photo-electric characteristics can be improved in a low concentration of the specific element when the film has a low level density and in a high concentration of the specific element when the film has a high defect level density.

FIG. 1 shows the relationship between the concentration of the specific element and the photo-electric characteristics in the Group III–V compound semiconductor in the case where Mg is added to GaN (GaN:H) containing the hydrogen atoms by way of example.

Since the hydrogen atoms are contained, the defect decreases as shown in FIG. 1. Therefore, when Mg is added, the photo-electric current (at the time of application of −1 V) increases and at the same time, the dark current (at the time of application of −1 V) becomes small. Similarly, the photo-electromotive current (at the time of application of 0 V) increases and the dark electromotive current (at the time of application of 0 V) decreases. Both photo-electric current and photo-electromotive current increase with the increase of the Mg concentration. An optimum Mg concentration gives the maximum photo-electric current and the maximum photo-electromotive current, and they decrease thereafter. This change is also similar in the change of the photo-electromotive voltage.

The optimum Mg concentration that provides the maximum photo-electric current and the maximum photo-electromotive current are low in film quality 1 having a small level density, and high in film quality 2 having a high level density.

It can be understood from the explanation given above that the photo-electric characteristics can be improved when the concentration of the specific element is selected in accordance with film quality, that is, with the defect level density.

The Group III–V compound semiconductor according to the present invention can be doped with an element for controlling the pn type (dopant).

Examples for then type dopant include the Group Ia (Li), the Group Ib (Cu, Ag, Au), the Group IIa (Mg), the Group IIb (Zn), the Group VIa (C, Si, Ge, Sn, Pb), the Group VIb (S, Se, Te), and so forth.

Examples for the p type dopant include the Group Ia (Li, Na, K), the Group Ib (Cu, Ag, Au), the Group IIa (Be, Mg, Ca, Sr, Ba, Ra), the Group IIb (Zn, Cd, Hg), the Group VIa (C, Si, Ge, Sn, Pb), the Group VIb (S, Se, Te), the Group VIa (Cr, Mo, W), the Groups VI, II and I (Fe, Co, Ni), and so forth.

The pn controlling dopants are preferably those which do not hinder bonding of the activated hydrogen atoms with the Group III or V element, that is, passivation of the defect level by the activated hydrogen atoms. In other words, it is preferred that the activated hydrogen atoms selectively combine with the Group III and V elements but do not bond with, and do not either inactivate, the dopants. C, Si, Ge and Sn are particularly preferred as the n type dopant and Be, Mg, Ca, Sr and Zn as the specific elements are particularly preferred as the p type dopant.

The hydrogen concentration, the specific element concentration and the concentration of the element for pn control may be constant in the depth-wise direction or may have a concentration distribution. When each of them has a concentration distribution, it can be expressed by a mean of the addition region. The hydrogen concentration, the specific element concentration and the element concentration for pn control can be determined also by the secondary ion mass spectrometer (SIMS).

The Group III–V compound semiconductor according to the present invention can be formed concretely and particularly preferably by the following method. The activated Group V element obtained by activating a Group V element-containing compound and the compound containing the Group III element are reacted in a hydrogen atmosphere or in an activated hydrogen atom atmosphere created by activating a hydrogen atom-containing compound to form a film. The specific element is then doped and entrapped into the film. When such a film-forming method is employed, organic radicals are separated as stable molecules from the organometallic compound even at a low-temperature and are not entrapped into the film. Therefore, the defects of the non-bonded bonds can be eliminated at the time of growing of the film. Furthermore, the activated hydrogen atoms created from the organic groups or the activated hydrogen atoms entrapped in the activated hydrogen atom atmosphere play the role of removing carbon on the film surface during the growth of the film and can reduce the impurities to extremely trace amounts. This method has its features in that the organometallic compound is used as the feed starting material of the Group III element of the Periodic Table and that the reaction can be carried out at a low temperature.

The term "activation" of hydrogen or the hydrogen atom-containing compound means that the hydrogen atom or the hydrogen atom-containing compound is brought into the energy state required for them to combine with the bonding defects and/or with the non-bonded bonds that occur in both the Group III element and Group V element. Alternatively, the term means that the hydrogen atoms or the hydrogen atom-containing compound is decomposed to create the excitation seed.

Examples of the hydrogen atom-containing compounds are the hydrogen molecules, ammonia, hydrocarbons, hydrogen halides and organometallic compounds. Particularly preferred among them is the hydrogen molecule because impurities do not mix.

The term "activation" of the Group V element-containing compound means that the Group V element-containing compound is brought into the energy state necessary for it to react with the orgnometallic compound containing the Group III element, or the Group V element-containing compound is decomposed to create the excitation seed.

Examples of the Group V element-containing compound are $N_2$, $NH_3$, $NF_3$, $N_2H_4$, methyl-hydrazine, $PH_3$, $AsH_3$, $As(CH_3)$, $P(CH_3)_3$, and so forth. These gases and liquids are vaporized and can be used either individually or under the mixed state while they are bubbled by a carrier gas.

The activated hydrogen atom and the activated Group V element may be activated independently from each other or simultaneously by, for example, using a gas containing both the Group V element such as $NH_3$ and the hydrogen atoms. In this case, $H_2$ may be further added. It is possible to employ the condition under which the active hydrogen atoms are isolated and generated from the organometallic compound containing the Group III element. In this way, it becomes possible to form a film of a single crystal or a non-single crystal the crystal defects of which are suppressed even at a low temperature. For, the activated Group III and V elements exist under the controlled state on the substrate and the hydrogen atoms convert the methyl group and the ethyl group generated from the organometallic compound containing the Group III element to inert molecules such as methane and ethane.

Radio frequency discharge, microwave discharge, electrocyclotron resonance system, helicon plasma system, and so forth, can be used as the activation method. These activation methods may be used either individually or in combination of two or more methods. Plural radio frequency discharges, plural microwave discharges or plural electron cyclotron resonance systems may be combined with one another, respectively. The radio frequency discharge may be of an induction type or a capacitance type. When different activation methods (excitation methods) are used, the discharge must be generated at the same pressure, and a pressure difference may be provided inside the discharge tube and inside the film forming part. Excitation energy of the excitation seed can be changed greatly by using different kinds of activation methods (excitation methods) such as the microwave and the radio frequency discharge when the discharge the discharge is generated at the same pressure. This method is effective for controlling film quality. In addition, ordinary chemical vapor deposition methods of organometallic compounds and molecular beam epitaxy method can be used, too. In this case, it is effective to use simultaneously active nitrogen or active hydrogen atoms.

At least one kind of organometallic compound containing the Group III element is preferably introduced from the downstream side of the activation means described above. When the organometallic compound is introduced from the downstream side, that is, when the organometallic compound containing the Group III element is mixed with the activated Group V element or with the activated hydrogen atom after the active Group V element or the activated hydrogen atom is obtained by the activation method, it becomes easier to control energy or the condition for decomposing the organometallic compound containing the Group III element. In this case, an activation apparatus is not contaminated.

Examples of the organometallic compounds containing the Group III element are trimethylaluminum, triethylaluminum, t-butylaluminum, trimethygallium, triethylgallium, t-butylgallium, trimethylindium, triethylindium, t-butylindium, and so forth. These liquids and solids are vaporized and are used either individually or in mixture while they are bubbled by a carrier gas.

Examples of the compounds containing the specific element are $BeH_2$, $BeCl_2$, $BeCl_4$, bis-cyclopentadienylmagnesium, diethylcalcium, dimethylstrontium, dimethylzinc, diethylzinc, and so forth. These compounds are preferably introduced from a gas introduction pipe disposed on the downstream side of the discharge space in the same way as the organometallic compound containing the Group III element.

The III–V compound semiconductors having an arbitrary conductivity type, such as an n type, an i type, a p type, etc, can be obtained by introducing the component containing the element for controlling the pn type. Examples of the compounds containing the dopant for the n type are $SiH_4$, $Si_2H_6$, $GeH_4$, $GeF_4$, $SnH_4$, and so forth. These compounds can be used either individually or in mixture while they are bubbled by a carrier gas. The gas containing the dopant for the p type can function also as the specific element-containing compound, and similar examples can be mentioned of. These compounds are introduced preferably from the gas introduction pipe disposed on the downstream side of the discharge space in the same way as the organometallic compound containing the Group III element.

Examples of the carrier gas are rare gases such as He and Ar, single element gases such as $H_2$ and $N_2$, hydrocarbons such as methane and ethane, and carbon halides such as $CF_4$ and $C_2F_6$. Auxiliary materials include rare gases such as He, Ne and Ar and halogen gases such as $H_2$, $Cl_2$ and $F_2$. These materials can be used either individually or in mixture. The auxiliary materials can be used appropriately for preventing the film defects by using them for controlling energy of the active seed and for converting the organic functional groups to inert molecules.

The hydrogen atom, the specific element and the element for controlling pn may be entrapped into the film simultaneously with the film formation by forming the film from the gas of the organometallic compound by the chemical vapor deposition method of the organometallic compounds. Alternatively, they may be entrapped after the film formation by thermally decomposing the gas containing each element by discharge or heat. Still alternatively, the compound containing each element may be entrapped into the film by sputtering or ion plating.

The Group III–V compound semiconductor according to the present invention is preferably grown at a growing temperature of not higher than 600° C. If the film forming temperature is higher than 600° C., the hydrogen atoms dissociate from inside the film and the number of defects becomes great in some cases.

Figure 2:
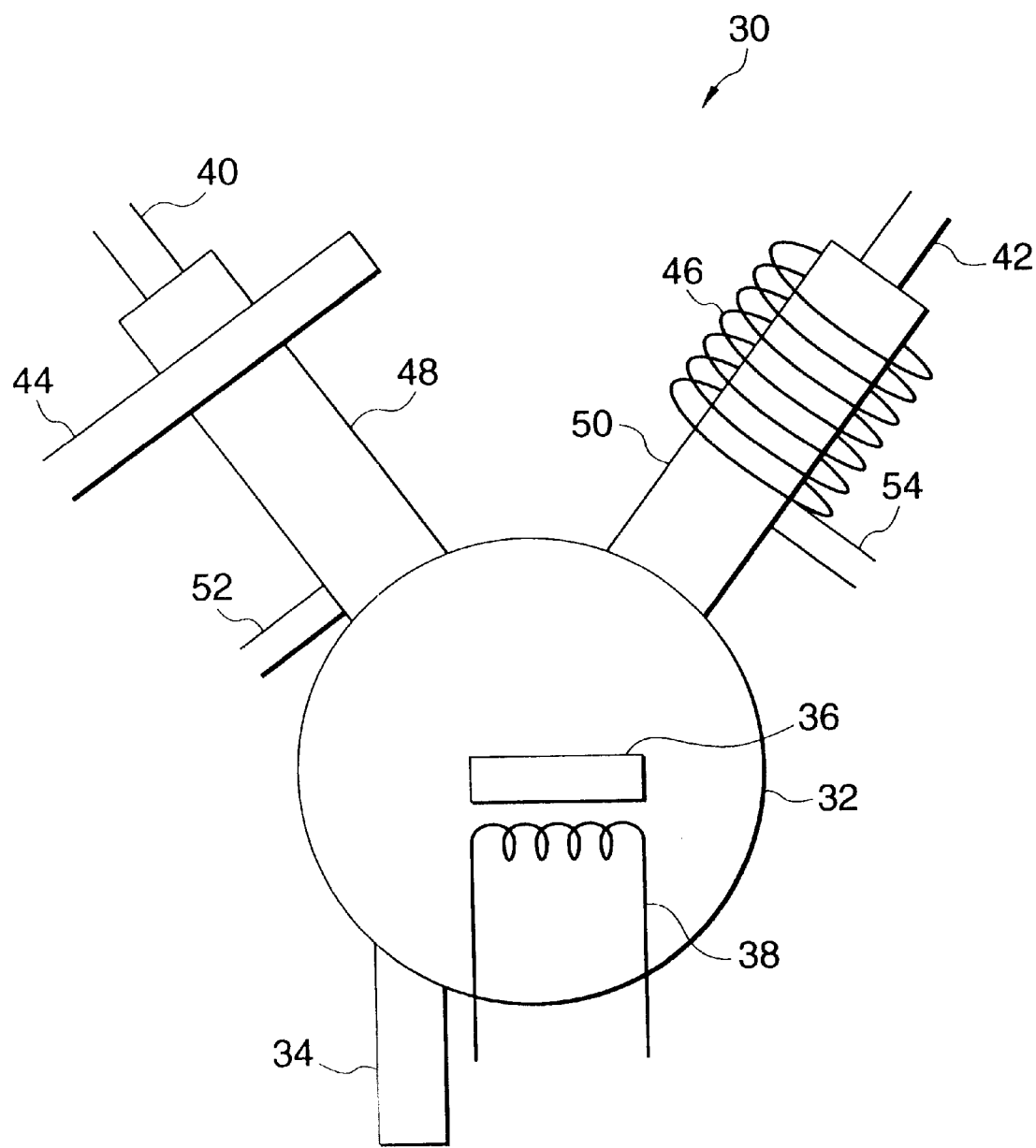
FIG. 2 is a schematic structural view showing an example of an apparatus for producing Group III–V compound semiconductor device according to the present invention.

Hereinafter, a method of producing the Group III–V compound semiconductor according to the present invention will be explained more concretely with a production apparatus used therefor (in the case of GaN:H:Mg) FIG. 2 is a schematic view showing an example of the apparatus used for plasma activation MOCVD process.

The plasma activation MOCVD process is a thin film producing method that uses plasma for activation. The apparatus 30 shown in FIG. 2 includes a vessel 32 capable of evacuation to vacuum, a substrate holder 36 connected to the vessel 32 and a heater 38 for heating the substrate. A quartz pipe 48 is equipped with a microwave guide 44, and a quartz pipe 50 is equipped with a radio frequency coil 46 connected thereto. A gas introduction pipe 52 is connected to the quartz pipe 48 at a part thereof that is downstream side of the portion of the microwave guide 44. A gas introduction pipe 54 is connected to the quartz pipe 50 at a part thereof that is downstream side of the radio frequency coil 46.

In this apparatus 30, an $N_2$ gas, for example, is used as a nitrogen element source and is introduced from the gas introduction pipe 40 into the quartz pipe 48. A microwave of 2.45 GHz is supplied into the microwave guide 44 that is connected to a microwave oscillator using a magnetron (not shown) to generate discharge in the quartz pipe 48. This discharge activates the $N_2$ gas inside the quartz pipe 48. This activation is effected so that an energy state necessary for inducing the reaction with a Ga-containing organometallic compound, or an energy state for cutting the excitation seed, that is, the Ga—C bond and the Ga—H bond, or an energy state for inducing radicals, can be established.

The $H_2$ gas, for example, is introduced from another gas introduction pipe 42 into the quartz pipe 50. A radio frequency of 13.56 MHz is supplied from a radio frequency oscillator (not shown) to the radio frequency coil 46 to generate the discharge inside the quartz pipe 50. Trimethylgallium is introduced from the downstream side of the discharge space through a third gas introduction pipe 52. The materials activated inside the respective quartz pipes 48 and 50 are introduced into the vessel 32, forming GaN:H on the substrate.

Furthermore, bis-cyclopentadienylmagnesium is introduced from the downstream side of the discharge space through a fourth gas introduction pipe 54, forming GaN-H:Mg.

Whether the Group III–V compound semiconductor according to the present invention proves to the single crystal or to the non-single crystal (amorphous, microcrystal, polycrystal or their mixed crystal) depends on the kind of the substrate, the substrate temperature, the flow rate of the gas and its pressure, the discharge input, and so forth. The composition of the Group III–V compound semiconductor that decides the value of the optical gap depends on the kind and composition of the starting gas, and the concentration and flow rate of the carrier gas. The growing rate depends on the concentration and flow rate of both starting gas and carrier gas, and discharge energy.

A crystalline substrate or a substrate obtained by etching the surface of an amorphous substrate can be used as the substrate. Crystalline films such as the films of the microcrystal and the polycrystal depend strongly on the growing condition.

The substrate temperature is preferably 100° C. to 600° C. If the substrate temperature is lower than 300° C., the crystal is likely to become amorphous and when it is higher than 300° C., it is likely to become the microcrystal or the polycrystal.

The flow rate of the gas and its pressure are preferably and substantially 0.001 to 10 sccm from the aspect of film quality. When the flow rate of the Group III starting gas is small, the crystal is likely to become the microcrystal. However, the substrate temperature exerts greater influences of the substrate temperature and the flow rate of the Group III starting gas. When the substrate temperature is higher than 300° C., therefore, the crystal is likely to become the microcrystal even though the flow rate of the Group III starting gas is great. On the other hand, when the flow rate of the Group III starting gas is great and moreover, when the discharge input is insufficient, the film is likely to become an organic film.

Introduction of various starting gases is effected through the respective gas inlets (gas introduction pipes 40, 42, 52 and 54 in FIG. 2). When the organometallic compound containing plural kinds of Group III elements and the compound containing the specific element are introduced, they may be introduced through the same or different gas introduction pipes.

The discharge input may be the one that can acquire the activated Group V element or the activated hydrogen atoms and is not particularly limited. When the discharge input is high, however, the crystal is likely to become the microcrystal or the polycrystal. When the film is formed by the hydrogen discharge in combination with the active hydrogen atom, for example, micro-crystallization or polycrystallization can be promoted much more than when it is not executed.

In order for the Group III–V compound semiconductor according to the present invention to have the single crystal or the columnar structure, the supply of the gas of the organometallic compound is switched from the continuous supply to the intermittent supply while the hydrogen discharge is effected further under the activation condition of the Group V element. The intermittent supply can be carried out preferably at a duty of 5% to 95%.

The element ratio (V/III ratio) of the organometallic compound containing the Group III element and the Group V element as the starting materials is preferably from 10 to 50,000.

The substrate on which the crystal of the Group III–V compound semiconductor of the present invention is grown is not particularly limited, and may be either electrically conductive or insulating. From the aspect of the use of the Group III–V compound semiconductor as the semiconductor device for the photo-electromotive device and the light reception device, however, the substrate which is similar to the later-appearing first electrode is preferably used.

The Group III–V compound semiconductor according to the present invention can be produced as described above, and can be utilized for the semiconductor devices.

(Semiconductor Device)

The semiconductor device according to the present invention is produced by disposing a layer of the Group III–V compound semiconductor of the present invention (hereinafter called sometimes the "semiconductor layer of the present invention") and a second electrode on the first electrode.

The semiconductor layer of the present invention may be any of the p type, the i type and the n type. It may be a layer having plural compositions of $Al_xGa_yIn_zN:H$ (x=0 to 1.0, y=0 to 1.0, z=0 to 1.0).

When the plural semiconductor layers of the present invention are laminated, the p type, the i type and the n type may be combined in an arbitrary combination. Each layer may have a composition of the Group III element and the Group V element expressed by a different $Al_xGa_yIn_z$ (x=0 to 1.0, y=0 to 1.0, z=0 to 1.0). Each may have a different specific element concentration. (Since the specific element bears the role of the p type dopant, the layer becomes the p type when the concentration is high and the i type when the concentration is low).

Any electrodes can be used for the first and second electrodes so long as they can exhibit the electrode function. For example, the first and second electrodes maybe a conductive layer formed on a conductive or insulating substrate, and may be formed of the single crystal or the non-single crystal. In the present invention, the first electrode bears the role of the substrate on which the semiconductor layer and the second electrode are formed, which holds them and which allows the semiconductor layer to form the film. The second electrode may be any of a full surface type, a ring type, a comb type and a net type.

Of the first and second electrodes, the electrode capable of optical input is preferably transparent to the input wavelength.

Examples of the materials of the conductive substrate are metals such as aluminum, stainless steel, nickel and chromium, and their alloys, and semiconductors such as Si, GaAs, GaP, GaN, SiC and ZnO. These materials can be as such used as the electrode.

In the case of the insulating substrate having the conductor layer formed thereon, a conduction treatment is applied to the surface of the insulating substrate, and the resulting conductor layer is used as the electrode.

Examples of the insulating substrate include films or sheet-like members of inorganic materials and organic resins (e.g. polycarbonate, polystyrene, polyethylene, polypropylene, polyimide, polysulfone, etc), polymer films, glass (e.g. leadglass, blue sheet glass, phosphosilicate glass, aluminosilicate glass, silica glass, barium phosphosilicate glass), quartz, ceramics, and so forth. Preferred examples of the transparent insulating substrate for the optical input are transparent inorganic materials such as glass, quartz, sapphire, MgO, LiF, $CaF_2$, etc, transaprent films or sheet-like members of organic resins such as fluororesin, polyester, polycarbonate, polyethylene, polyethylene terephthalate, epoxy resin, etc, and optical plates such as optical fiber and celluphoc optical plate.

The film of the conductor layer can be formed by sputtering, vacuum depositing or ion plating the metals described above or a conductive material such as gold, silver or copper. However, the material is transparent to the wavelength of the optical input. Examples of the materials of the transparent conductor layer for the optical input include ITO, zinc oxide, tin oxide, lead oxide, indium oxide, copper iodide, or a thin film of a metal such as Al, Ni or Au to a thickness that is translucent to the wavelength of the optical input.

The first electrode is particularly preferably any of the substrates produced by forming a conductor layer on glass, a metal substrate and a Si substrate. The conductor film is preferably an oxide film containing at least one of tin, zinc, indium and titanium. The metal is particularly preferably Al and Al alloys. When the Si substrate is used as the first electrode, it can be used for a hybrid device in combination with an electronic device.

Single crystal silicon, polycrystalline silicon, microcrystalline silicon and hydrogenated amorphous silicon can be used for the Si substrate. The microcrystalline silicon and hydrogenated amorphous silicon may be formed on other substrates. Germanium may be contained in the Si substrate as a whole or as a part of the layers. The resistance of the Si substrate may be controlled, and the conductivity type may be any of the p type, the i type and the n type. The plane orientation of the silicon crystal may be (100), (110) and (111).

The second electrode is particularly preferably any of the transparent conductor layers and metals. The transparent conductor layer is particularly preferably an oxide film containing at least one of tin, zinc, indium and titanium. The metal may be an alloy of plural metals or their laminate.

The semiconductor device according to the present invention may further contain a $p^+$ or $n^+$ layer as a film to which doping is made in a high concentration, or a $p^-$ or $n^-$ layer as a film to which doping is made in a low concentration, between the electrode and the semiconductor layer of the present invention to improve photo-electric characteristics.

These $p^+$, $n^+$, $p^-$ and $n^-$ layers may have mutually different compositions of Al, Ga, In and N expressed by $Al_xGa_yIn_z$ (x=0 to 1.0, y=0 to 1.0, z=0 to 1.0), or may be formed of a layer having plural $Al_xGa_yIn_zN:H$ (x=0 to 1.0, y=0 to 1.0, z=0 to 1.0) compositions.

The semiconductor device according to the present invention can be used as a light reception device.

In this case, the semiconductor layer of the present invention may be a single layer or a tandem type multi-layered structure the optical gap of which becomes greater progressively towards the light incidence side. The semiconductor device according to the present invention can be used as a wavelength separating light reception device by taking out independently the photoelectric currents from the layers having different optical gaps. When the semiconductor layer of the present invention is formed on a silicon substrate having a light reception structure such as a pin structure that uses crystalline silicon, polyrcrystalline silicon or hydrogenated amorphous silicon, it becomes possible to separate the visible rays and light of a short wavelength, or to supplement insufficiency of the sensitivity of the silicon light reception device to short wavelengths.

The semiconductor device according to the present invention can be used also as a light emitting device (display device).

In this case, too, an economical silicon substrate can be used as the first electrode in place of the conventional expensive sapphire substrate, and a light emitting diode or a laser driven by transistors and integrated circuits formed on the silicon substrate can be fabricated. In this way, the electronic device and the light emitting device can be integrated with each other.

The semiconductor device according to the present invention can be used also as a photo-voltaic device. Most simply, a transparent conductor film such as ITO or $SnO_2$ and a thin metal film as an electrode are disposed on the semiconductor layer deposited on an opaque substrate such as a metal or silicon, and the photo-voltage can be generated in a Shottky barrier film. In this case, the semiconductor device of the present invention can be used as the window material on the light incidence side of the conventional silicon type solar cell. Furthermore, when a film of a nitride type compound having an optical gap greater than that of a silicon type solar cell is laminated into a tandem structure, a solar cell having high efficiency can be produced.

When the crystalline silicon is used for the substrate, the semiconductor layer of the present invention having a greater optical gap than that of the crystalline silicon is laminated in an np type, an nip type, a pn type or a pin type structure on the crystalline silicon having the np structure or the pn type structure. A transparent electrode can be disposed on the light incidence side.

The semiconductor device according to the present invention can arbitrarily change the optical gap. At least two kinds of the semiconductor layers of the present invention having different optical gaps as the active regions for generating the optical carrier are laminated in the npnp structure, the nipnip structure, the pnpn structure or the pinpin structure, to achieve a tandem structure in match with the absorption wavelength so that the optical gap becomes progressively greater towards the light incidence side. The layers for forming the tandem structure may be two or more.

A high efficiency solar cell can be produced in the same structure in the case of microcrystalline silicon and hydrogenated amorphous silicon.

The semiconductor layer of the present invention may be laminated in the np structure, the pn structure, the nip structure or the pin structure or its repeating structure, on a transparent conductive substrate for light incidence, having a heat resistance of at least 600° C., so that the optical gap becomes progressively greater towards the transparent conductive substrate, and microcrystalline silicon or hydrogenated amorphous silicon may be disposed on the laminate structure.

According to such a structure, light ranging f rom green, at which the solar ray spectrum has the maximum radiation intensity and which lowers efficiency of the silicon type solar cell, to blue and further to the ultraviolet region, can be utilized effectively. In this way, a high efficiency solar cell can be accomplished.

Furthermore, when crystalline silicon containing germanium or polycrystalline silicon or hydrogenated amorphous silicon is used for the silicon substrate, light can be utilized effectively over a broad range from a short wavelength light including the ultraviolet region to long wavelength light including the infrared region.

The semiconductor device according to the present invention can bear the two functions of the photo-voltaic device and the photodetector. When the semiconductor device of the present invention is used, the electronic circuit and the display device can be driven by the function of the photo-electromotive device, and the light reception input can be displayed through the display device by the semiconductor light reception device, for example. More concretely, the semiconductor device according to the present invention can be utilized in a light quantity measuring apparatus, or the like, that utilizes the input of the solar cell for a power source and a signal source.

When this semiconductor device is transparent, the device can be disposed on the display device and can be integrated with the latter. Therefore, an apparatus as an integral unit of a solar cell, a light reception device and a display device, that is compact in size and excellent in design, can be fabricated, for example.

Using the Group III–V compound semiconductor described above, the semiconductor device according to the present invention has no limitation to the shape and the size, and is economical. Therefore, an integrated apparatus that is compact in size and excellent in design, or a large-scale apparatus, can be produced easily.

The semiconductor device according to the present invention can change the optical gap in the full region ranging from the infrared region to the ultraviolet region. It can effectively utilize the rays of light over the broad range of from the infrared to the ultraviolet range in the photodetector and the photo-voltaic device.

The semiconductor device according to the present invention has high performance and a small change with time, is excellent in response, environmental resistance characteristics and high temperature resistance, and can easily accomplish photo-electronic devices.

EXAMPLES

Hereinafter, the present invention will be explained concretely with reference to Examples thereof but is in no way limited thereto.

Example 1

A washed Si substrate having a plane orientation (100) is put on a substrate holder 36 in a production apparatus shown in FIG. 2. After a vessel 32 is evacuated to vacuum through an exhaust port 34, the substrate is heated to 400° C. by a heater 38. An $N_2$ gas is introduced at 2,000 sccm into a quartz pipe 48 having a diameter of 25 mm through a gas introduction pipe 40. A microwave of 2.45 GHz is set to an input of 250 W. After a tuner establishes matching, discharge is effected through a microwave guide 44. A reflected wave is 0 W at this time. A hydrogen gas ($H_2$) is introduced at 1,000 sccm into a quartz pipe 50 having a diameter of 30 mm from a gas introduction pipe 42. The input of a radio frequency of 13.56 MHz is set to 100 W and is inputted through a radio frequency coil 46. Under this state, the reflected wave is 0 W. The vapor of trimethylgallium (TMGa) held at 0° C. is used with a carrier gas through a gas introduction pipe 52. While bubbling is made by the carrier gas of Nitrogen at 780 Torr, the TMG with carrier gas is intermittently introduced at a maximum flow rate of 0.2 sccm through a mass flow controller (MFC). The introduction interval is introduction for 5 seconds and stop for 5 seconds.

Bis-cyclopentadienylmagnesium ($Cp_2Mg$) is heated at 50° C., and nitrogen is introduced to 80 Torr. The resulting mixed gas is continuously passed at 2 sccm through the mass flow controller from a gas introduction pipe 54. The reaction pressure measured at this time by a Varatron vacuum gauge is 0.5 Torr. The $Cp_2Mg$ flow rate with respect to the flow rate of TMGa determined from the conversion factor of MFC at this time is 0.04. Film formation is effected for 60 minutes, and a 0.3 μm-thick GaN:H:Mg film is formed.

Similarly, a GaN:H:Mg film is formed on each of a sapphire substrate having a plane orientation (0001) (hereinafter called the "sapphire substrate") and a substrate prepared by sputtering indium tin oxide on Corning 7059 glass (hereinafter called the "ITO substrate").

When the compositions of the resulting GaN:H:Mg films are measured by an RBS (Rutherford back scattering), the Ga/N ratio is 0.95 and corresponds substantially to a stoichiometric ratio.

Figure 3:
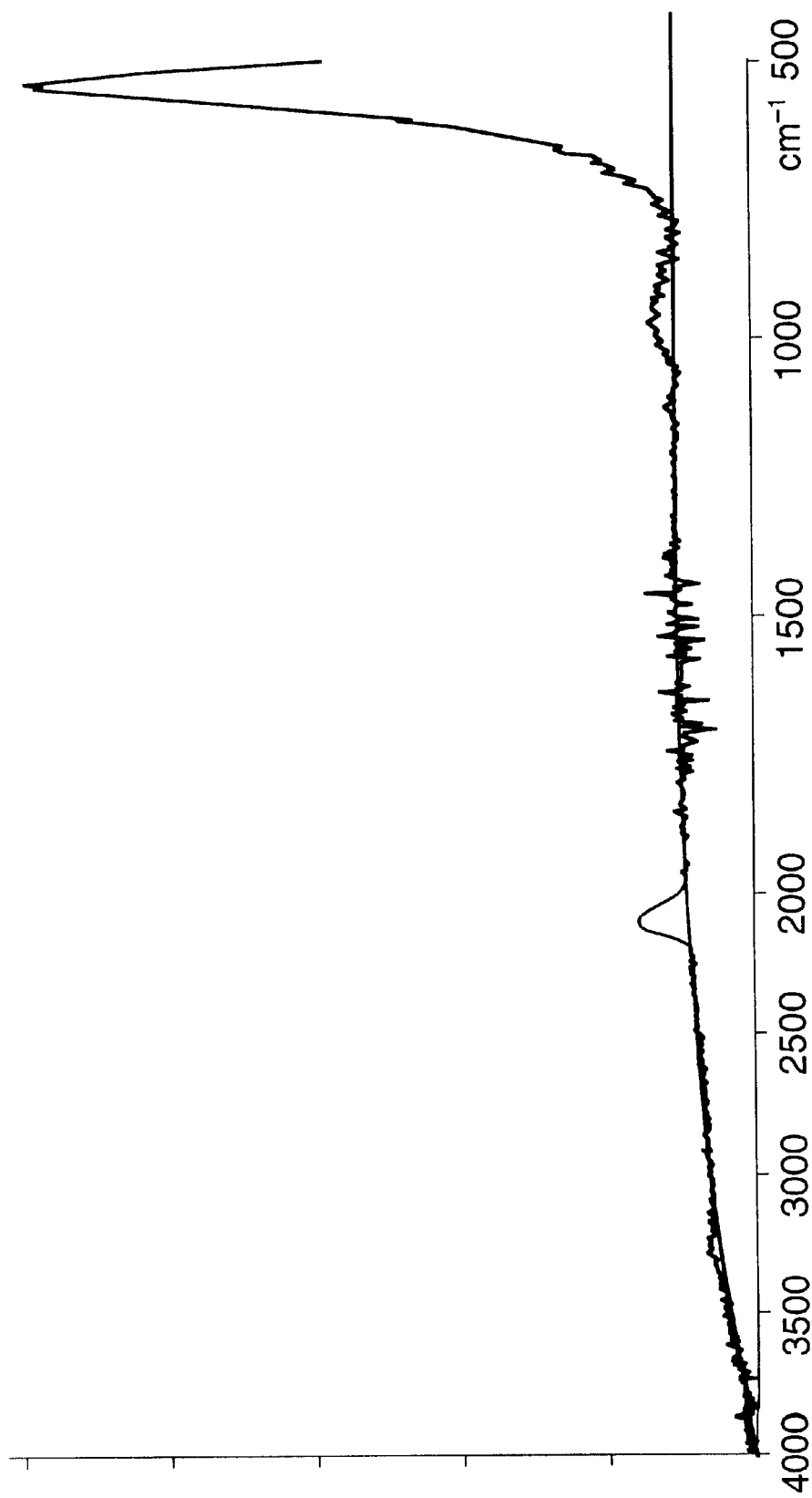
FIG. 3 is a diagram showing an IR absorption spectrum of a GaN:H:Mg film obtained in Example 1.

The measurement result of the IR absorption spectrum of each of the resulting GaN:H:Mg films measured by an FTIR apparatus is shown in FIG. 3.

As shown in FIG. 3, absorption can be observed near 3,300 $cm^{-1}$, near 2,100 $cm^{-1}$ and 557 $cm^{-1}$. They are the infrared absorption peaks resulting from the N—H bond, the Ga—H bond and Ga—N bond, respectively. It can be thus understood that the hydrogen atom is contained.

The absorption coefficient of the infrared absorption peak based on the N—H bond is 200 $cm^{-1}$, and the absorption coefficient of the infrared absorption peak based on the Ga—H bond is 800 $cm^{-1}$.

Furthermore, the film on the sapphire substrate is measured, too. Absorption of the Ga—N cannot be measured by absorption of the substrate, but the absorption coefficient of the infrared absorption peak based on the N—H bond is 180 $cm^{-1}$ and the absorption coefficient of the infrared absorption peak based on the Ga—H bond is 820 $cm^{-1}$.

Ratios (intensity ratios) Ia/Ic and Ib/Ic are 0.02 and 0.08, respectively, where Ia is absorbance of the infrared absorption peak based on the N—H bond, Ib is absorbance of the infrared absorption peak based on the Ga—N bond and Ic is absorbance of the infrared absorption peak based on the Ga—N bond.

When the hydrogen concentration of this film is measured by HFS, it is 7 atom %.

When the Mg amount measured by SIMS is determined using the density of GaN, the Mg concentration in the resulting GaN:H:Mg film is 3.8 atom %. This value is substantially in agreement with the concentration of 4.0 atom % in the gas that is calculated from the vapor pressure at 50° C.

Figure 4A:
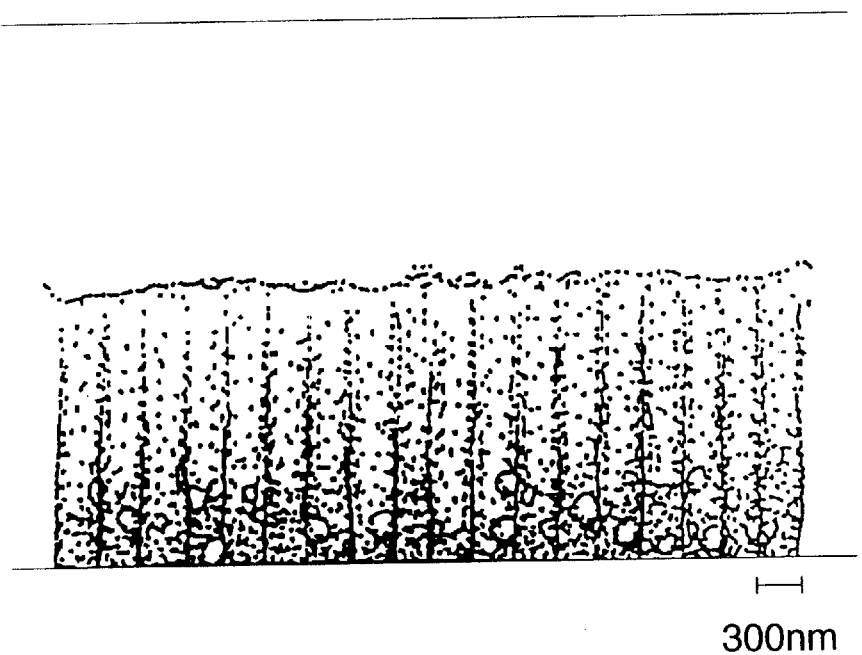
FIGS. 4(a) and 4(b) are schematic views of SEM sectional photographs of a GaN:H:Mg film formed on a sapphire substrate and a GaN:H:Mg film formed on a Si substrate, respectively.
Figure 4B:
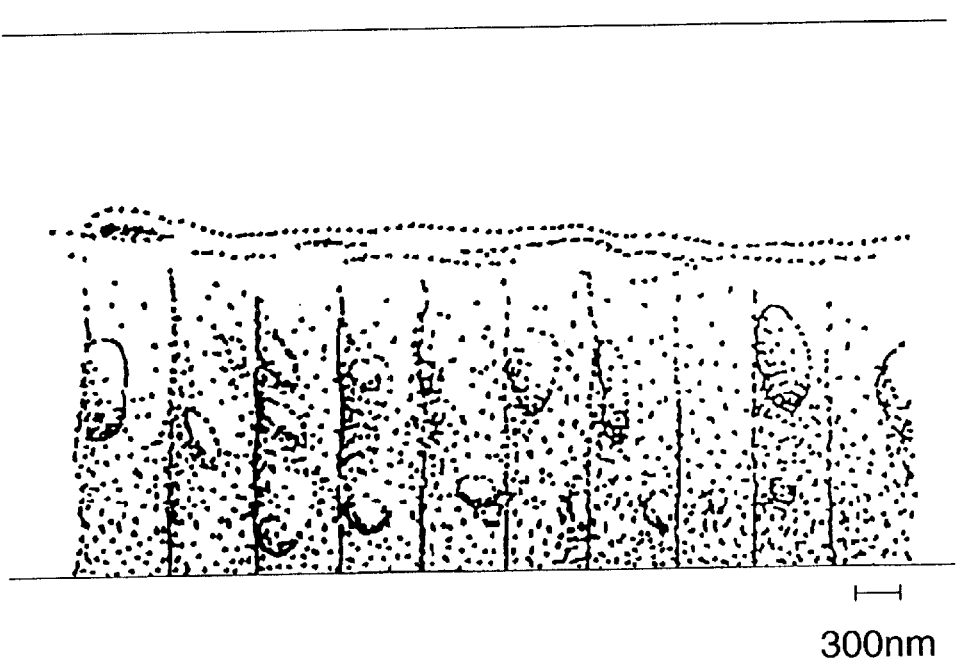

When the X-ray diffraction patterns of the GaN:H:Mg film formed on Si and the GaN:H:Mg film formed on the sapphire substrate are measured, it is found out that the (0001) plane of the hexagonal system has grown in both of them. When the surface and section of each of them are observed through a scanning electron microscope (SEM), a columnar structure having a diameter of 30 to 50 nm is observed. FIGS. 4(a) and 4(b) schematically show this columnar structure. FIG. 4(a) shows the section of the GaN:H:Mg film formed on the sapphire substrate and FIG. 4(b) shows the section of the GaN:H:Mg film formed on the Si substrate.

A semiconductor device is fabricated by vacuum depositing a transparent gold electrode having a diameter of 3 mm to the GaN:H:Mg film formed on the ITO substrate. When a voltage of −1 V is applied and a dark current is measured, the current is found to be $3 \times 10^{-10}$ A. When a photoelectric current is measured using ultraviolet rays of a 325 nm He—Cd laser at 20 mW, having a spot diameter of 2.0 mm, a photoelectric current of 1.1 mA can be observed. An internal quantum efficiency is 0.42. After the ultraviolet rays are cut off, the current decreases to the order of $10^{-9}$ within one second. A short-circuit current ($I_{sc}$) at 0 V is 0.5 mA and an open circuit voltage ($V_{oc}$) is 1.3 V. As a result, it is found that the semiconductor device can be used as a high sensitive photoconductor and a photo-voltaic device.

A light power measuring apparatus is produced by using the resulting semiconductor device and by using the power source as a solar cell and the signal source as a photodetector. This apparatus operates satisfactorily.

Comparative Example 1

A GaN:H film is formed in the same way as in Example 1 with the exception that Cp$_2$Mg is not introduced from the gas introduction pipe 54.

When the IR absorption spectrum of the GaN:H film so formed is measured using an FTIR apparatus, infrared absorption peaks based on the N—H bond and the Ga—H bond are observed near 3,200 cm$^{-1}$ and near 2,100 cm$^{-1}$, respectively. Their absorption coefficients are 100 cm$^{-1}$ and 200 cm$^{-1}$, respectively. An infrared absorption peak based on the Ga—N bond is observed near 557 cm$^{-1}$, too, and Ia/Ic and Ib/Ic are 0.004 and 0.01, respectively. The hydrogen concentration is determined to be 4 atom % from Ga—H and N—H absorption intensity.

When the surfaces and sections of the GaN:H:Mg film formed on Si and the GaN:H film formed on the sapphire substrate are inspected by a scanning electron microscope (SEM), a columnar structure having a diameter of 30 to 50 nm is observed in both of them.

A semiconductor device is fabricated by vacuum depositing a transparent gold electrode having a diameter of 3 mm to the GaN:H film formed on the ITO substrate. When a voltage of −1 V is applied and a dark current is measured, the dark current is found to be $10^{-3}$ A. Furthermore, when a photoelectric current is measured by a ultraviolet ray of 325 nm of a He—Cd laser, the current is in the order of $10^{-3}$ A, and the increase of the current is hardly observed.

Comparative Example 2

A GaN:H:Mg film is prepared in the same way as in Example 1 with the exception that Cp$_2$Mg bubbled by a nitrogen gas and heated to 30° C. is introduced at 1 sccm from the gas introduction pipe 54 in place of Cp$_2$Mg introduced at 2 sccm from the gas introduction pipe 54 in Example 1.

When the IR absorption spectrum of the resulting GaN-H:Mg film is measured by using the FTIR apparatus, infrared absorption peaks based on the N—H bond and the Ga—H bond are observed near 3,300 cm$^{-1}$ and near 2,100 cm$^{-1}$, respectively. Their absorption coefficients are 100 cm$^{-1}$ and 250 cm$^{-1}$, respectively. An infrared absorption peak based on the Ga—N bond is observed near 557 cm$^{-1}$, too, and Ia/Ic and Ib/Ic are 0.005 and 0.015, respectively. The hydrogen concentration is determined to be 4 atom % from absorption of Ga—H and N—H.

The Mg concentration in the GaN:H:Mg film calculated from the vapor pressure at 30° C. is 50 ppm.

The surfaces and sections of the GaN:H:Mg film formed on Si and the GaN:H:Mg film formed on the sapphire substrate are observed through the scanning electron microscope (SEM), and a columnar structure having a diameter of 30 to 50 nm is observed in both of them.

A semiconductor device is produced by vacuum depositing a transparent gold electrode having a diameter of 3 mm to the GaN:H:Mg film formed on the ITO substrate. When a voltage of −1 V is applied and a dark current is measured, the dark current is $10^{-5}$ A. When the photoelectric current is measured by ultraviolet rays of a 325 nm He—Cd laser, the increase of a current of $1.5 \times 10^{-5}$ A can be observed but the internal quantum efficiency is 0.0057. As a result, it is found that a photoelectric current as the photodetector is not sufficient, and $V_{oc}$ is 0.1 V and is not sufficient, either, as the photo-voltaic device.

Example 2

A GaN:H:Mg film is formed in the same way as in Example 1 with the exception that a nitrogen gas is introduced at 1,000 sccm into the quartz pipe 48 in place of the nitrogen gas introduced at 2,000 sccm into the quartz pipe 48 in Example 1 and Cp$_2$Mg bubbled by the nitrogen gas is introduced at 1 sccm from the gas introduction pipe 54 in place of Cp$_2$Mg introduced at 2,000 sccm from the gas introduction pipe 54 in Example 1.

Figure 5:
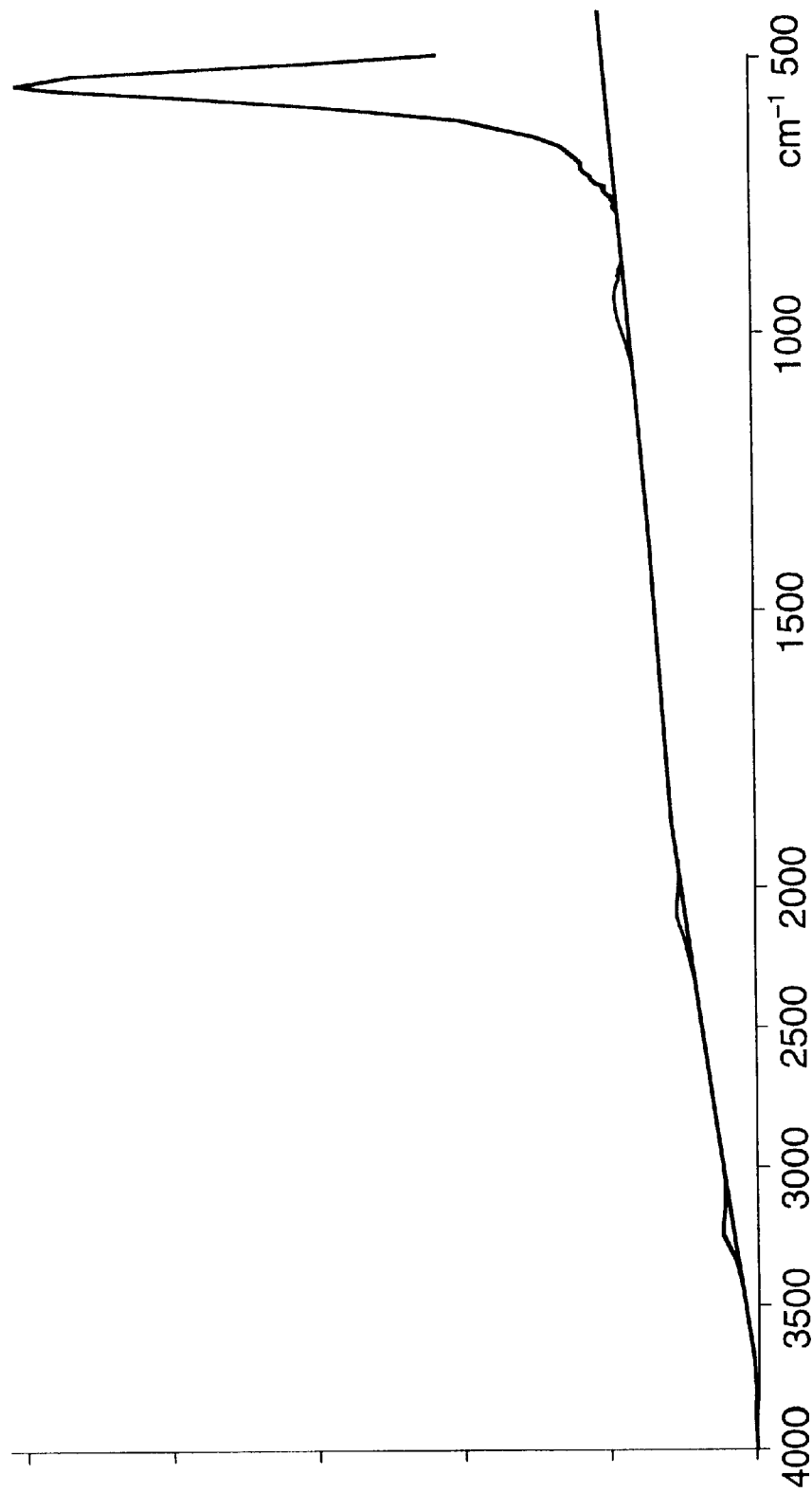
FIG. 5 is a diagram showing an IR absorption spectrum of a GaN:H:Mg film obtained in Example 2.

FIG. 5 shows the measurement result of the IR absorption spectrum of the resulting GaN:H:Mg film measured by using the FTIR apparatus.

As shown in FIG. 5, the infrared absorption peaks based on the N—H bond and the Ga—H bond are observed near 3,200 cm$^{-1}$ and 2,100 cm$^{-1}$, respectively, and their absorption coefficients are 280 cm$^{-1}$ and 330 cm$^{-1}$, respectively. The infrared absorption peak based on the Ga—N bond is observed near 557 cm$^{-1}$, and Ia/Ic and Ib/Ic are 0.011 and 0.013, respectively. The hydrogen concentration is determined to be 5 atom % from the HFS measurement and the SIMS measurement.

The Mg concentration in the resulting GaN:H:Mg film is 2.0 atom % calculated from the vapor pressure at 30° C.

When the surfaces and sections of the GaN:H:Mg film formed on Si and the GaN:H:Mg film formed on the sapphire substrate are observed through the scanning electron microscope (SEM), a columnar structure having a diameter of 30 nm is observed in both of them.

A semiconductor device is produced by vacuum depositing a transparent gold electrode having a diameter of 3 mm to the GaN:H:Mg film formed on the ITO substrate. When a voltage of −1V is applied and a dark current is measured, the dark current is $5\times10^{-10}$ A. Furthermore, when a photoelectric current is measured by ultraviolet rays of a spot diameter of 2 mm of 325 nm He—Cd laser, a photoelectric current of 0.6 mA can be measured. After the ultraviolet rays are cut off, the current decreases to the order of $10^{-9}$ within one second. The internal quantum efficiency is 0.23. $I_{sc}$ is 0.3 mA and $V_{oc}$ is 1.2 V. As a result, it is found that the semiconductor device can be used as a high-sensitive photodetector and a photo-voltaic device.

Example 3

A GaInN:H:Mg film is formed in the same way as in Example 1 with the exception of the following points. The nitrogen gas is introduced at 1,000 sccm into the quartz pipe 48 in place of 2,000 sccm of the nitrogen gas introduced into the quartz pipe 48 in Example 1, methylindium held at 10° C. is introduced at 0.9 sccm from the gas introduction pipe 52 through the master flow controller while it is bubbled by the nitrogen gas as a carrier gas at 780 Torr, and Cp$_2$Mg bubbled by the nitrogen gas is heated and converted to a mixed gas and is then introduced continuously at 2 sccm from the gas introduction pipe 54 through the master flow controller in place of of Cp$_2$Mg introduced at 2 sccm from the gas introduction pipe 54 in Example 1.

When the IR absorption spectrum of the resulting GaInN:H:Mg film is measured using the FTIR apparatus, the infrared absorption peaks based on the N—H bond and the Ga—H bond are observed near 3,200 cm$^{-1}$ and near 2,100 cm$^{-1}$, respectively, and their absorption coefficients are 200 cm$^{-1}$ and 1,070 cm$^{-1}$, respectively. The infrared absorption based on the Ga—N bond is observed near 557 cm$^{-1}$, too, and Ia/Ic and Ib/Ic are 0.015 and 0.080, respectively. The hydrogen concentration is determined to be 8 atom % from the absorption of N—H and GaIn—H.

The Mg concentration in the resulting GaInN:H:Mg film is 5.0 atom % when calculated from the vapor pressure at 50° C.

A semiconductor device is produced by vacuum depositing a translucent gold electrode having a diameter of 3 mm to the GaInN:H:Mg film formed on the ITO substrate. The rays of light from an Xe lamp of 1 KW are analyzed by a spectroscope to obtain a constant light power light source. Using this apparatus, a photoelectric current spectrum is measured. The maximum current is obtained at a wavelength of 400 nm in the irradiation of light power of 10 µW/cm$^2$ at the application of 0 V, and the internal quantum efficiency is 0.8. $V_{oc}$ by the solar ray in the fine weather is 0.8 V and the current of 10 µA is obtained. As a result, it is found that the semiconductor device can be used as a high-sensitive photodetector and a photo-electromotive device.

Example 4

A GaN:H:Mg film is produced in the same way as in Example 1 with the exception that Cp$_2$Mg bubbled by the nitrogen gas is introduced at 8 sccm from the gas introduction pipe 54 in place of Cp$_2$Mg introduced at 2 sccm from the gas introduction pipe 54 in Example 1.

When the IR absorption spectrum of the resulting GaN:H:Mg film is measured using the FTIR apparatus, the infrared absorption peaks based on the N—H bond and the Ga—H bond are observed near 3,200 cm$^{-1}$ and near 2,100 cm$^{-1}$, respectively, and their absorption coefficients are 200 cm$^{-1}$ and 1,300 cm$^{-1}$, respectively. An infrared absorption peak based on the Ga—N bond is observed near 557 cm$^{-1}$, too, and Ia/Ic and Ib/Ic are 0.05 and 0.17, respectively. The hydrogen concentration is determined to be 10 atom % by the HFS measurement.

The Mg concentration of the resulting GaN:H:Mg film is determined as 8.0 atom % when calculated from the vapor pressure at 50° C.

When the surfaces and sections of the GaN:H:Mg film formed on Si and the GaN:H:Mg film formed on the sapphire substrate are observed through the scanning electron microscope (SEM), a columnar structure having a diameter of 30 nm is observed with a granular crystal.

A semiconductor device is produced by vacuum depositing a transparent gold electrode having a diameter of 3 mm to the GaN:H:Mg film formed on the ITO substrate. When a voltage of −2 V is applied and a dark current is measured, the dark current is $1\times10^{-10}$ A. When the photoelectric current is measured by ultraviolet rays of 325 nm He—Cd laser having a spot diameter of 2 mm, the photoelectric current of 0.7 mA can be measured. Though the internal quantum efficiency is 0.27, the current decreases to the order of $10^{-9}$ within one second after the ultraviolet rays are cut off. $I_{sc}$ is 0.2 mA and $V_{OC}$ is 0.6 V. As a result, it is found that the semiconductor device can be used as a high-sensitive photodetector and a photo-voltaic device.

Example 5

A GaN:H:Mg film is formed in the same way as in Example 1 with the exception that radio frequency discharge is not effected, TMG is introduced continuously but not intermittently, and Cp$_2$Mg bubbled by the nitrogen gas is introduced at 20 sccm from the gas introduction pipe 52 in place of Cp$_2$Mg introduced at 2 sccm from the gas introduction pipe 54 in Example 1.

When the IR absorption spectrum of the resulting GaN-H:Mg film is measured using the FTIR apparatus, the infrared absorption peaks based on the N—H bond, the Ga—H bond and the Ga—N bond are observed near 3,200 cm$^{-1}$, 2,100 cm$^{-1}$ and near 557 cm$^{-1}$, respectively. Ia/Ic and Ib/Ic are 0.2 and 0.4, respectively. The absorption of Ga—H and N—H is greater than in Example 3, and the hydrogen concentration is 30 atom %.

The Mg concentration in the resulting GaN:H:Mg film is 17.0 atom % when calculated from the vapor pressure at 50° C.

When the surfaces and sections of the GaN:H:Mg film formed on Si and the GaN:H:Mg film formed on the sapphire substrate are observed through the scanning electron microscope (SEM), a granular structural portion accounts for the major proportion.

A semiconductor device is produced by vacuum depositing a translucent gold electrode having a diameter of 3 mm to the GaN:H:Mg film formed on the ITO substrate. When a voltage of −2 V is applied and a dark current is measured, the dark current is $5\times10^{-10}$ A. When the photoelectric current is measured by ultraviolet rays having a spot diameter of 2 mm of 325 nm He—Cd laser, a photoelectric current of $10^{-6}$ A can be measured, and the internal quantum efficiency is 0.038. The current decreases to the order of $10^{-9}$ within one second after the ultraviolet rays are cut off, and drops thereafter gradually to the order to $10^{-10}$. The light/dark ratio after cut-off the rays of light is $10^4$. $I_{sc}$ is 0.5 µA and $V_{occ}$ is 0.3 V. It is thus found that the semiconductor device can be used practically as a high-sensitive photodetector and a photo-voltaic device.

Comparative Example 3

A GaN:H:Mg film is formed in the same way as in Example 5 with the exception that Cp$_2$Mg is introduced at 30 sccm from the gas introduction pipe 54 in place of Cp$_2$Mg introduced at 20 sccm from the gas introduction pipe 54 in Example 5.

When the IR absorption spectrum of the resulting GaN-H:Mg film is measured using the FTIR apparatus, the infrared absorption peaks based on the N—H bond and the Ga—H bond are observed near 3,200 cm$^{-1}$ and near 2,100 cm$^{-1}$, respectively. Furthermore, the infrared absorption peak based on the Ga—N bond is observed near 550 cm$^{-1}$, too, and Ia/Ic and Ib/Ic are 0.3 and 0.5, respectively. The hydrogen concentration is determined to be 40 atom % from the absorption of Ga—H and N—H.

The Mg concentration in the resulting GaInN:H:Mg film is 22 atom % when calculated from the vapor pressure at 50° C.

When the surfaces and sections of the GaN:H:Mg film formed on Si and the GaN:H:Mg film formed on the sapphire substrate are observed through the scanning electron microscope (SEM), a columnar structure can be observed.

A semiconductor device is produced by vacuum depositing a transparent gold electrode having a diameter of 3 mm to the GaN:H:Mg film formed on the ITO substrate. When a voltage of −1V is applied and a dark current is measured, the dark current is 4×10$^{-10}$ A. When the photoelectric current is measured by ultraviolet rays having a spot diameter of 2 mm of a 325 nm He—Cd laser, it is 10$^{-8}$ A. The current decreases to the order of 10$^{-9}$ after the ultraviolet rays are cut off, and thereafter drops gradually to the order of 10$^{-10}$. The light/dark ratio after cut-off of light is 10. I$_{sc}$ is 0.005 μA and V$_{oc}$ is 0.02 V. It is thus found that the semiconductor device is not sufficient as the photodetector and the photo-voltaic device.

As explained above, the present invention can provide the Group III–V compound semiconductor that is free from the limitation of the shape and size and is economical, the Group III–V compound semiconductor that is excellent in the photo-electric characteristics (photo-electric conductivity, photo-voltaic current, photo-voltage, quantum efficiency), the Group III–V compound semiconductor that can freely select the optical gap over a broad range, has high performance as a photo-semiconductor, has a limited change with time and is excellent in response, environmental resistance characteristics and high temperature resistance, and a semiconductor device using the Group III–V compound semiconductor.

What is claimed is:

1. A Group III–V compound semiconductor comprising mainly a Group III element and a Group V element of the Periodic Table, and containing 0.1 atom % to 40 atom % of hydrogen atoms and 100 ppm to 20 atom %, based on the sum of the atomic numbers of said Group III element and said Group V element, of at least one element selected from among Be, Mg, Ca, Zn and Sr.

2. A Group III–V compound semiconductor according to claim 1, which contains 2,500 ppm to 15 atom %, based on the sum of the atomic numbers of said Group III element and said Group V element, of at least one element selected from the group consisting of Be, Mg, Ca, Zn and Sr.

3. A Group III–V compound semiconductor according to claim 1, which is a non-single crystal compound.

4. A Group III–V compound semiconductor according to claim 1, which has a columnar structure.

5. A Group III–V compound semiconductor according to claim 1, wherein ratios Ia/Ic and Ib/Ic are not greater than 0.5, respectively, wherein:

Ia is the absorbance of an infrared absorption peak based on bonding between said Group V element and the hydrogen atom, Ib is the absorbance of an infrared absorption peak based on said Group III element and the hydrogen atom, and Ic is the absorbance based on bonding between said Group III element and said Group V element.

6. A Group III–V compound semiconductor according to claim 1, wherein an absorption coefficient (absorbance/film thickness) of the infrared absorption peak based on bonding between said Group V element and the hydrogen atom and an absorption coefficient (absorbance/film thickness) of the infrared absorption peak based on bonding between said Group III element and the hydrogen atom are 5 cm$^{-1}$ to 5,000 cm$^{-1}$, respectively.

7. A semiconductor device comprising a layer formed of said Group III–V compound semiconductor according to claim 1 and a second electrode, each being disposed on a first electrode.

8. A semiconductor device according to claim 7, which is a photo-voltaic device or a photoconductor.

9. A semiconductor device according to claim 7, which bears the two functions of a photo-voltaic device and a photodetector.

* * * * *